United States Patent
Shanmuganathan et al.

(10) Patent No.: US 10,288,663 B1
(45) Date of Patent: May 14, 2019

(54) METHOD AND APPARATUS FOR INJECTING CURRENT OVER AN ELECTRICAL CONDUCTOR

(71) Applicant: Saudi Arabian Oil Company, Dhahran (SA)

(72) Inventors: Muruganandham Shanmuganathan, Riyadh (SA); Saad M. Shammari, Riyadh (SA)

(73) Assignee: Saudi Arabian Oil Company, Dhahran (SA)

(*) Notice: Subject to any disclaimer, the term of this patent is extended or adjusted under 35 U.S.C. 154(b) by 0 days.

(21) Appl. No.: 15/800,871

(22) Filed: Nov. 1, 2017

(51) Int. Cl.
| | | |
|---|---|---|
| *G01R 19/00* | (2006.01) | |
| *G01R 31/02* | (2006.01) | |
| *G01V 3/06* | (2006.01) | |
| *G01R 31/04* | (2006.01) | |

(52) U.S. Cl.
CPC ......... *G01R 31/023* (2013.01); *G01R 31/045* (2013.01); *G01V 3/06* (2013.01)

(58) Field of Classification Search
CPC .. G01R 31/023; G01R 31/021; G01R 31/025; G01R 31/026045; G01R 31/043; G01R 13/465; G01R 13/641; G01V 3/06
See application file for complete search history.

(56) References Cited

U.S. PATENT DOCUMENTS 3,678,372 A   7/1972  Elder
4,215,306 A * 7/1980  Mace ..................... F02P 17/00
                                                320/105
4,573,012 A * 2/1986  Bisson ................. G01R 33/123
                                                324/222

(Continued)

FOREIGN PATENT DOCUMENTS

| EP | 0721100 A2 | 7/1996 |
|---|---|---|
| GB | 889452 A | 2/1962 |
| KR | 2005-0008205 A | 1/2005 |

OTHER PUBLICATIONS

International Search Report & Written Opinion dated Feb. 18, 2019 for related application PCT/US2018/058345 filed Oct. 31, 2018.

*Primary Examiner* — Thang X Le
(74) *Attorney, Agent, or Firm* — Abelman, Frayne & Schwab

(57) ABSTRACT

A portable current injection test apparatus for injecting a predetermined amount of current through an electrical conductor includes an encasement which houses a first transformer having primary and secondary windings, the secondary winding coupled to a pair of output terminals, and a variable transformer having primary and secondary windings and a control switch. The variable transformer's primary winding is electrically coupled to a power source and its secondary winding is electrically coupled to the primary winding of the first transformer. The variable transformer switch manually controls power output at the secondary winding of the first transformer. First and second probes are connected to the output terminals and their distal ends are configured to inject the predetermined amount of current through the electrical conductor. A short circuit condition is defined across the secondary winding of the first transformer while the predetermined amount of current is injected through the electrical conductor.

15 Claims, 5 Drawing Sheets

(56) References Cited

U.S. PATENT DOCUMENTS

| | | | |
|---|---|---|---|
| 4,736,158 A | | 4/1988 | McCartney |
| 4,809,123 A | * | 2/1989 | Allington ......... G01R 19/16571 324/509 |
| 5,055,793 A | | 10/1991 | Mulcahey |
| 5,481,198 A | * | 1/1996 | Patel ...................... G01N 17/00 204/404 |
| 5,929,624 A | | 7/1999 | Ricq et al. |
| 6,169,406 B1 | * | 1/2001 | Peschel .................. G01R 31/14 324/511 |
| 7,902,810 B2 | | 3/2011 | Naylor et al. |
| 2011/0193497 A1 | * | 8/2011 | Finch ...................... H02M 5/12 315/307 |

\* cited by examiner

METHOD AND APPARATUS FOR INJECTING CURRENT OVER AN ELECTRICAL CONDUCTOR

FIELD OF INVENTION

The present invention relates to electronic test equipment and more specifically, to a portable electric test apparatus for injecting current onto a shorted electrical conductor such as a wire or cable to perform various types of electrical tests.

BACKGROUND OF INVENTION

Electricians, IT personnel, technicians and other individuals who install, route, maintain or otherwise work with wire cabling, such as armored cables (AC), non-metallic (NM-B) cables, underground feeder (UF) cables, coaxial cables, Ethernet (Cat-5e) cables, among other well-known commercially available cables and wires often encounter difficulties in identifying which cable among a plurality of cables is routed to a particular source and/or load of interest, or may be suspected of failing to deliver a required current flow to its load because of being physically damaged. Various test devices are known in the art to assist a technician in the field to identify or otherwise distinguish a particular electrical cable from other electrical cables in the vicinity.

U.S. Pat. No. 4,736,158 discloses a device for identifying wires extending between two spaced-apart test units, i.e., a source unit and a destination unit. The wire identification is achieved by implementing different resistive loads at the destination unit and selectively sending a current from the source unit to the destination unit. Logic circuitry is provided to identify which wire is carrying the current from the source unit to the destination unit.

U.S. Pat. No. 5,055,793 discloses a transmitter having an LC tank circuit and a loop antenna for transmitting an inductively created alternating current (AC) signal at a predetermined operating frequency along an underground cable, which in turn generates an alternating electromagnetic field in response to the current flow. A portable receiver unit can detect the electromagnetic field produced by the alternating current along the cable.

U.S. Pat. No. 5,929,624 discloses a method of detecting the presence of an armored cable by injecting a pulsed current onto the armored shielding which is grounded, and using a detector to detect the pulsed signal at a remote location. Alternatively, U.S. Pat. No. 7,902,810 discloses a device for injecting current over a cable and detection of an AC signal that is derived by capacitive coupling of the input signal produced on the cable.

The prior art current injection and detection devices include various complex logic circuitry and/or the use of specialized signal detection devices for injecting and detecting current in a conductive cable. These test devices can be expensive to manufacture and cumbersome to operate. Accordingly, it would be desirable to provide a simple to use, low cost, portable electrical testing device that can inject an alternating current on a cable to assist a technician with identifying a particular cable in a cable bundle, or a ground fault location in a cable, or conduct other electrical tests which require an injected current. It is further desired to be able to detect an injected signal over a conductive wire or cable with a conventional, commercially available amp/voltage meter.

SUMMARY OF THE INVENTION

The disadvantages and shortcomings of the prior art are overcome by the various embodiments of a current injection test apparatus and method of using the same as disclosed and claimed herein in which, in one embodiment, a current injection test apparatus for injecting a predetermined amount of current through an electrical conductor comprises: a housing having an interior; a first transformer mounted in the housing interior and having a primary winding and a secondary winding, the secondary winding coupled to a pair of output terminals; a variable transformer mounted in the interior and having a primary winding, a secondary winding and a control actuator, the primary winding configured to receive power from an alternating current power source, the secondary winding electrically coupled to the primary winding of the first transformer, wherein power on the secondary winding of the first transformer is selectively controlled by the actuator of the variable transformer; and a pair of probe leads each having a proximal end and a distal end, the proximal ends being configured for electrical connection with one of the pair of output terminals, and the distal ends being configured to inject the predetermined amount of current through the electrical conductor, wherein a short circuit condition is defined across the secondary winding of the first transformer while the predetermined amount of current is injected through the electrical conductor.

In one aspect, a power switch provides power from the alternating current power source to the primary winding of the variable transformer. In another aspect, a cooling fan is mounted in the interior of the housing and configured to receive power from the alternating current power source via a power switch. In yet another aspect, the current injection test apparatus further comprises a current protection device for preventing passage of an undesirable power surge from the alternating current power source.

In another aspect, a handle coupled to the housing. In still another aspect, the current injection test apparatus further comprises a frame, wherein the housing is mounted to a lower portion of the frame and a handle is formed by an upper portion of the frame. In yet another aspect, at least one rotatably-mounted support coupled proximate to a lower portion of the housing to support and move the test apparatus on a surface. The at least one rotatably-mounted support can include a pair of wheels rotatably mounted proximate to the lower portion of the housing.

In one aspect, an ammeter is mounted on the housing and electrically connected to the secondary winding of the first transformer. In another aspect, the control actuator of the variable transformer includes markings indicating at least one of a range of voltage values and a range of wire gauge values.

In still another aspect, the variable transformer is configured to selectively apply at the primary winding of the first transformer, up to approximately ten percent of a rated voltage of the first transformer when the secondary winding thereof is shorted, to thereby achieve a full load current at the shorted secondary winding of the first transformer. In yet another aspect, the variable transformer is configured to provide a voltage to the primary winding of the first transformer in a range of 0-120 volts. In another aspect, the first transformer is configured to provide a maximum current output of approximately 31 amperes.

In another embodiment, a method for injecting a predetermined amount of current through an electrical conductor comprises: providing a portable current injector including a housing having an interior; a first transformer mounted in the housing interior and having a primary winding and a secondary winding, the secondary winding being coupled to a pair of output terminals mounted on the housing; a variable transformer mounted in the housing interior and having a primary winding, a secondary winding and a control actuator, the primary winding configured to receive power from an alternating current power source, the secondary winding electrically coupled to the primary winding of the first transformer, the secondary winding of the first transformer being selectively controlled by the variable transformer control actuator; and a pair of probe leads each having a proximal end and a distal end, each proximal end being configured for electrical connection with one of the pair of output terminals, and the distal ends being configured to inject the predetermined amount of current through the electrical conductor; connecting a proximal end of a first of the pair of probe leads to a first of the pair of outputs of the test apparatus and a distal end of the first probe lead to a proximal end of the electrical conductor; electrically connecting a distal end of the electrical conductor to a common electrical contact; connecting a proximal end of the second of the pair of probe leads to the second of the pair of outputs of the test apparatus and a distal end of the second probe lead to the common electrical contact; adjusting the variable transformer control actuator to a predetermined setting; injecting a current through the electrical conductor via the probe leads, wherein a short circuit condition is defined across the secondary winding of the first transformer while the predetermined amount of current is injected through the electrical conductor; and monitoring for the injected current through the electrical conductor.

In one aspect, the monitoring step comprises providing a clamp meter to measure the flow of current through the electrical conductor. In another aspect, the electrical conductor is one of a plurality of electrical cables, the method further comprising checking for the injected current flowing through at least one of the plurality of cables with a portable amperage meter; and identifying the one of the plurality of cables with the injected current flowing there through. In still another aspect, the electrical conductor is an electrical cable and the monitoring step comprises using a portable meter to take a plurality of current measurements of the injected current along the length of the cable beginning at a proximal end and progressing towards a distal end of the electrical cable; and identifying a location closest to the proximal end of the cable where the portable meter measures a substantial decrease in the injected current as being a shorted portion of the electrical cable.

In yet another aspect, the method further comprises extending the electrical conductor through a loop of a current transformer, and the monitoring step comprises measuring an induced current from the current transformer with an ammeter. In another aspect, the method further comprises the steps of: providing a thermal overload relay having a current overload tripping mechanism which forms the electrical conductor, the tripping mechanism being electrically connected between the distal ends of the probe leads; adjusting the control actuator to increase the injected current through the probe leads until the tripping mechanism of the thermal overload relay trips; and wherein the monitoring step includes measuring the injected current when the tripping mechanism trips. In yet another aspect, the step of providing the thermal overload relay includes electrically connecting one of the pair of probe leads to an input terminal and the other probe lead to an output terminal of the tripping mechanism under test.

In one aspect, the electrical conductor is a first ammeter, and the method further comprises the steps of electrically connecting the distal ends of the pair of probe leads to corresponding first and second electrical leads of the first ammeter; providing a second ammeter that is electrically connected to the secondary winding of the first transformer; and wherein the monitoring step comprises comparing measured current readings across the second winding of the first transformer from the first and second ammeters.

BRIEF DESCRIPTION OF THE DRAWINGS

FIGS. 5A-5C are pictorial illustrations in which FIG. 5A depicts the current injection test apparatus of FIG. 1 being used to test a current transformer, FIG. 5B depicts the current injection test apparatus of FIG. 1 being used to test an ammeter, and FIG. 5C depicts the current injection test apparatus of FIG. 1 being used to test the current transformer with an ammeter.

Figure 1:
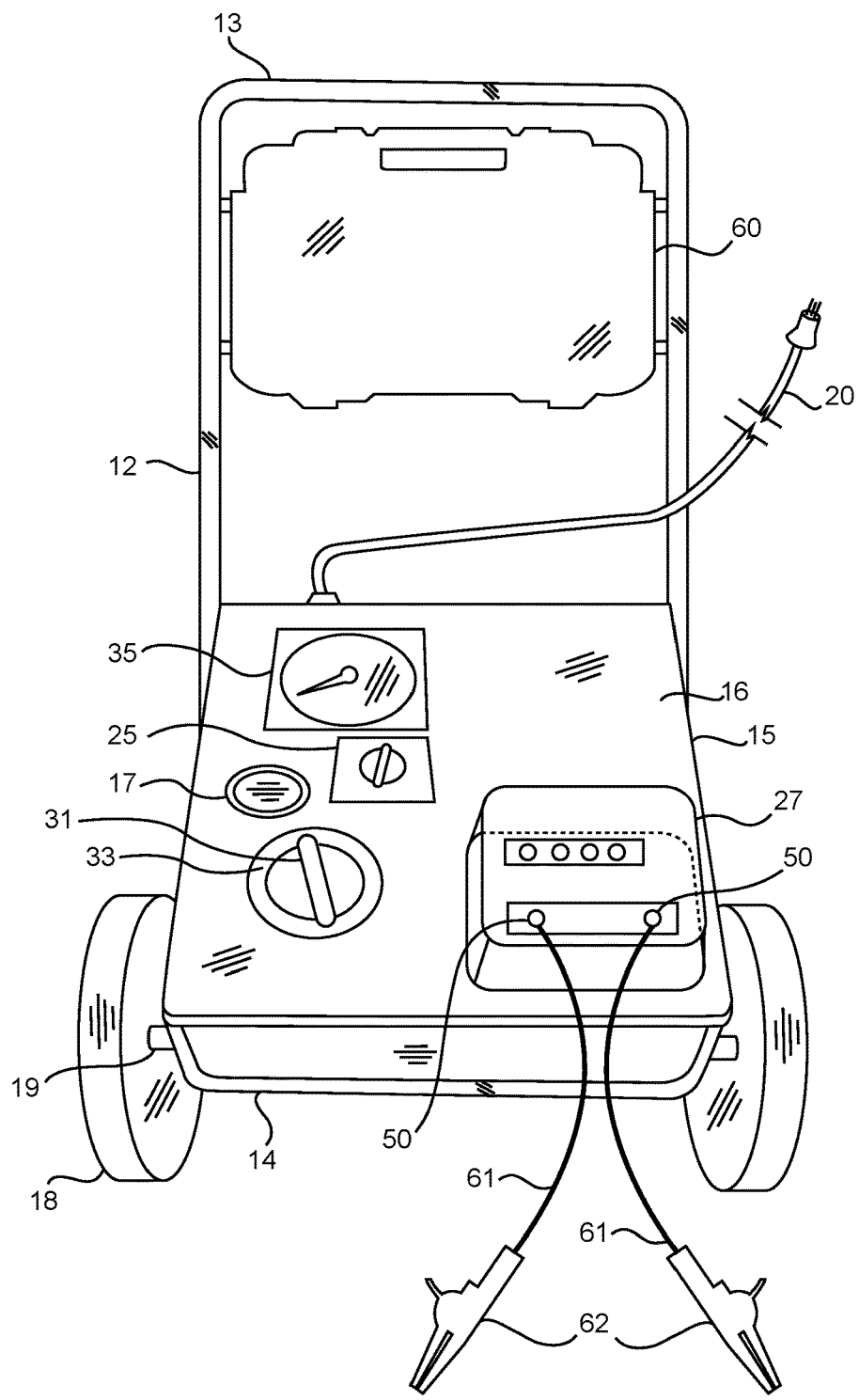
FIG. 1 is a front perspective view of a portable current injection test apparatus having an on-board electric power circuit for injecting current on a cable or load in accordance with the present invention.

In the following description of the invention, identical reference numerals have been used, when appropriate, to designate the same or similar elements that are common to the figures. Unless specifically stated otherwise, the features shown in the figures are not drawn to scale, but are shown for illustrative purposes only.

DETAILED DESCRIPTION OF THE INVENTION

In one aspect, the invention is directed to a method, apparatus and system for injecting current on one of a plurality of cables to identify the cable from the plurality of cables or to identify a ground fault location on a grounded cable. Alternatively, the current injection test apparatus can be used to test a current transformer, an ammeter, a thermal overload relay among other devices, or otherwise provide temporary power to a load.

More specifically, an illustrative embodiment of a portable current injection test apparatus for injecting a predetermined amount of current through an electrical conductor includes an encasement which houses a first transformer having primary and secondary windings, in which the secondary winding is coupled to a pair of output terminals, and a variable transformer having primary and secondary windings and a control switch. The variable transformer's primary winding is electrically coupled to a power source, while the secondary winding of the variable transformer is electrically coupled to the primary winding of the first transformer. The variable transformer switch is manually operated to control power output at the secondary winding of the first transformer. A pair of probes is provided in which a proximal end of each is connected to one of the output terminals and a corresponding distal end of the probes is configured to inject the predetermined amount of current through the electrical conductor. A short circuit condition is defined across the secondary winding of the first transformer while the predetermined amount of current is injected through the electrical conductor.

Referring to FIG. 1, a representative embodiment of the portable current injection (CI) test apparatus 10 of the present invention is illustratively shown. The CI test apparatus 10 includes a frame 12, and an enclosure 15 that houses electronic circuitry 21 (which is described in detail below with respect to FIG. 2) for generating and injecting a predetermined current over a shorted conductive wire or cable or to a load. The frame 12 includes an upper portion 13 which is illustratively configured as a handle, and a lower portion 14 on which the enclosure 15 is mounted. A pair of mobile supports 18 is illustratively depicted as a pair of rotatable-mounted wheels axially mounted to the frame 12 or enclosure 15 to support and guide the CI test apparatus 10, e.g., to a test site. Although the mobile supports 18 are depicted as a pair of wheels 18 mounted to the frame 12 or enclosure 15 via one or more axles 19, the number and type of supports is not to be considered limiting. For example, at least one rear support (not shown) such as a third wheel or a vertical leg can also be attached to further assist in moving and maintaining the CI test apparatus 10 in an upright position. Although the upper portion 13 of the frame 12 is illustratively shown as being configured as a handle, such configuration is not to be considered limiting. For example, a handle can extend from a top and/or rear portion of the enclosure 15. The frame 12 and enclosure 15 are fabricated from any suitable material such as aluminum, stainless steel, or other suitable metals or a durable polymeric material, and can be formed integrally or as separate components that are assembled together by fasteners, snap-fittings and/or other well-known techniques.

The injection circuit of the CI test apparatus 10 includes a pair of transformers, i.e., a variable transformer serially coupled with and to control the current output of a main transformer. In one aspect, current injection over an electrical conductor (e.g., cable) is provided by shorting the secondary windings of the main transformer, which is based in part on a technique for conducting a transformer short-circuit test to determine winding losses in a transformer. Generally, transformers are fabricated with two components, i.e., the ring-shaped metal (e.g., iron, laminate steel, among other well-known materials) core and the conductive metal (e.g., copper) wire windings wrapped around the transformer core. Transformers are often used to isolate a portion of a circuit and/or to increase (step up) or decrease (step down) the output voltage at its secondary winding with respect to the source voltage at the primary winding. As transformers are ubiquitous along power lines, electric appliance and other electrical circuits, electrical equipment manufacturers typically take into account the values of transformer losses associated with the core and windings when designing their electrical equipment/products. Testing the efficiency of a transformer can be performed by conducting two tests, i.e., an open circuit test and a short circuit test. The power required to conduct the open and short circuit tests is generally equal to the power loss that occurs in the transformer. The open circuit test can be used to determine no-load losses e.g., hysteresis, eddy current and other losses from the core of the transformer. Alternatively, the short circuit test can be used to determine load related losses, which include heat and eddy currents occurring in the primary and secondary copper windings of the transformer.

Figure 2:
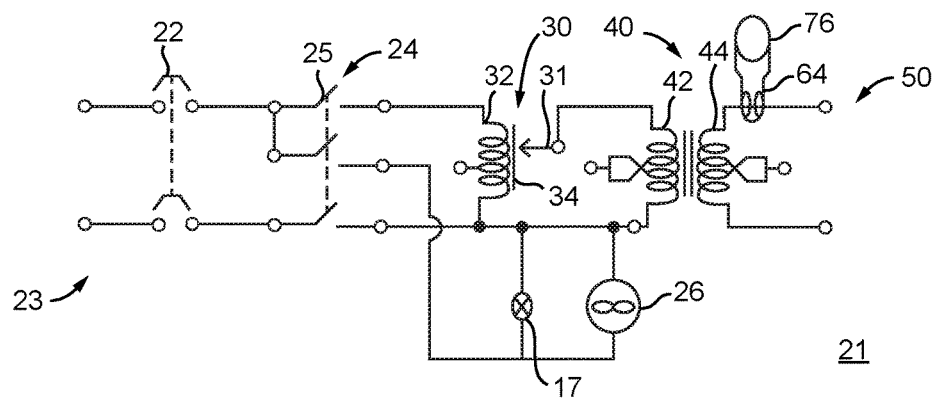
FIG. 2 is a schematic diagram of a current injection circuit of the test apparatus of FIG. 1.

Referring now the schematic diagram of FIG. 2, the current injection circuitry 21 includes a variable transformer 30 having its primary winding 32 electrically coupled to an external alternating current (ac) power source via a power switch 24 and its secondary winding 34 electrically coupled to a primary winding 42 of a main (or first) transformer 40. The secondary winding 44 of the main transformer 40 is coupled to a pair of output ports or terminals 50. The variable transformer 30 can be manually adjusted to produce a selected voltage at the primary winding 42 of the main transformer 40 to thereby provide a desired current output at the output terminals 50. A pair of probe leads 62 each having a proximal end are electrically connected to the pair of output terminals 50, and a distal end of each probe 62 can be used to inject a desired current over a cable 70 or other electrical conductor, as illustratively shown and discussed in greater detail with respect to FIGS. 3-6.

More specifically, the CI circuitry 21 includes an input 23 which is connected to a power source (e.g., an external 110 VAC, 60 Hz electrical wall outlet) via the electric power cord 20 (FIG. 1). Power from the external wall outlet at the input leads 23 is selectively delivered to the auto transformer 30 via the power switch 24. Circuit protection is illustratively provided between the hot and common input leads 23 via a circuit breaker 22. Alternatively, a fuse or other circuit protection devices/circuitry can be provided to protect the internal circuitry 21 of the CI test apparatus 10. The power switch 24 selectively controls power to the primary winding 32 of the variable transformer (i.e., auto-transformer or VARIAC) 30, as well as providing power to a cooling fan 26 and a power indicating lamp 17, which will indicate the power status of the CI test apparatus 10. In one embodiment, the variable transformer 30 is illustratively a STACO ENERGY PRODUCTS, INC. model no. 3PN1010B having a rating of 120V, although such auto-transformer is not considered limiting.

Referring again to FIG. 1, illustratively mounted on a front or top panel 16 of the enclosure 15 are various switches, indicator lights, current/voltage output terminals and meters/gauges to enable a technician to operate and monitor the CI test apparatus 10. The quantity, type and location of the switches, indicators and meters on the enclosure 15 are not considered limiting. Preferably, the CI test apparatus 10 includes the power indicator lamp 17 which is illuminated when an actuator 25 (e.g., toggle switch, rotatable knob, lever, and the like) of the switch 24 is activated and power from an external wall outlet is being delivered via the power cord 20 to the primary winding 32 of the variable transformer 30. A power gauge 35, such as an ammeter is also mounted to the enclosure 15 for easy viewing and, in conjunction with an actuator 31 (e.g., a rotatable dial, slidable knob, lever, and the like) that controls the variable transformer 30, enables a technician to provide appropriate current settings at the outputs 50 from the secondary winding 44 of the main transformer 40. A gas-tight enclosure 27 is preferably mounted to the front/top portion 16 of the enclosure 15. The gas-tight enclosure 27 includes copper bus bars which serve as the positive and negative/ground electrodes that are electrically coupled to the output terminals 50. The gas-tight enclosure 27 provides additional safety for operating personal during testing, as well to protect the output terminals 50 when idle. A person of ordinary skill in the art will appreciate that the switches, gauges and indicators depicted in FIG. 1 are for illustrative purposes and are not considered limiting.

The gas-tight enclosure 27 further includes the pair of output terminals 50 from which probe leads 62 can be electrically connected for use during testing of a cable 70, conductor, or other device as discussed in further detail with respect to FIGS. 3-6. A storage compartment 60 can be provided, for example, at the upper portion 13 of the frame 12 to conveniently retain the probe leads 62 and/or other ancillary test equipment as required for specific applications.

The actuator 31 of the variable transformer 30 which is illustratively located on the front or top panel of the enclosure can be any well-known knob, lever or dial such as a rotatable dial or knob, a slidable bi-directional lever, or any other control interface that is otherwise adjustable and can be set by the technician to provide the desired voltage output at the secondary winding 34 of the variable transformer 30, which in turn provides a desired voltage and current at the secondary winding 44 of the main transformer 40. The main transformer 40 is preferably a step-down transformer that is able to provide a high-ampere rating with a low voltage applied on the secondary winding 44 of the main transformer 40. In one embodiment, the main transformer 40 is a General Electric Corp. model number 9T5130011 having a rating of 460/240/120V, 60 Hz, 1.5 KVA, although such type and model of transformer is not considered limiting.

The two output leads of the secondary winding 44 (e hot and common/ground leads) are electrically connected to corresponding hot and common output terminals 50 which are configured to receive the lead lines 61 of the conductive probes 62, such as the alligator clips illustratively shown in the drawings. The probe leads 62 can be removably or permanently connected to the output terminals 50. The hot and common probes 62 can be respectively colored or otherwise marked red and black as is well-known in the art. Although the probes 62 are illustratively shown as being alligator clips, such probe configuration is not considered limiting as other well-known probe leads can be provided.

Figure 3:
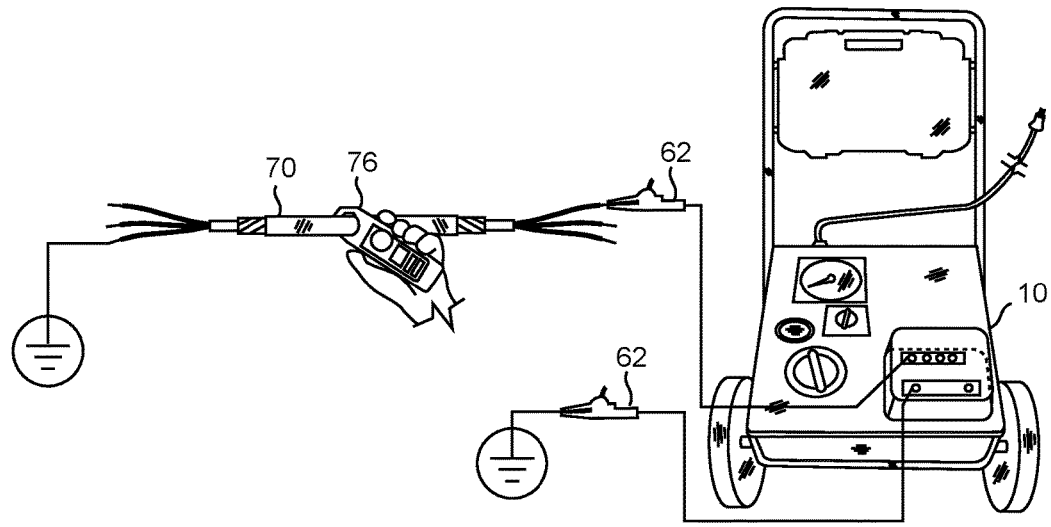
FIG. 3 is a pictorial illustration depicting the current injection test apparatus of FIG. 1 as used to inject a current over one conductor in a multi-conductor cable.

Retelling now to FIG. 3, the current injection test apparatus 10 is illustratively shown being used to identify or trace a cable 70 such as, for example, a cable routed in a building structure or other area where numerous or a bundle of cables are routed (e.g., in a cable rack) and it is difficult to trace a specific cable of interest. During a cable tracing/identifying procedure, the power over the cable 70 is first terminated at the source, e.g., via a switch, circuit breaker, node connection and the like. The technician attaches a first (e.g., red) probe 62 to one of the cable conductors, e.g., a white wire conductor, and the second (e.g., black) probe 62 to ground or another common reference point. A distal end of the cable 70 will also have a connection to ground or the common reference point illustratively through the wire conductor or cable shielding. The CI test apparatus 10 is configured to operate in a manner similar to implementing a short-circuit test on the main transformer 40 and, accordingly current can be injected over the cable 70 or conductor under test from the CI test apparatus 10 to ground.

During a short circuit test on a transformer, normally ten percent (10%) of the rated voltage is applied on the primary side of the transformer when the secondary side is shorted. The required full load current is achieved on the secondary winding side and the copper loss on the transformer can be calculated for its efficiency. The technician controls the voltage applied to the primary side 42 of the main transformer 40 by manually setting the variable transformer 30. Accordingly, a range of voltages between zero and the maximum voltage from the power source (e.g., 110 Volts) can be applied to the primary winding 42 of the main transformer 40 by the variable transformer 30. Table I below illustrates test results observed during a short circuit test for the above-mentioned. GE transformer model no. 975130011, which is suitable for use in an embodiment of the CI test apparatus 30.

TABLE I

| Primary Voltage (V) | Primary Current (A) | Secondary Voltage (V) | Secondary Current (A) |
|---|---|---|---|
| 0.52 | 0 | 0.27 | 0 |
| 10.29 | 1.5 | 5.36 | 3.2 |
| 20.54 | 3.6 | 10.71 | 7.3 |
| 30.41 | 5.3 | 15.86 | 10.5 |
| 40.21 | 7.2 | 21.05 | 14.2 |
| 50.1 | 8.5 | 26.25 | 16.8 |
| 60.0 | 10 | 31.36 | 20.0 |
| 70.0 | 11.1 | 36.4 | 21.5 |
| 80.6 | 12 | 41.9 | 23 |
| 90.2 | 13 | 46. | 25 |
| 100 | 13.8 | 51.5 | 27.2 |
| 110 | 14.9 | 55.8 | 31.3 |

Preferably, approximately ten percent (10%) of the rated potential can be applied at the primary side of the main transformer 40 to achieve the full loadable current at the secondary side while it is shorted. The variable transformer 30 is provided to easily and safely control the applied voltage (e.g., 10% rated voltage) on the primary side 42 of the main transformer 40. Accordingly, without a physical load, if the secondary winding 44 of the main transformer 40 is shorted, and the recommended 10% voltage is applied at the primary winding 34, then the full load current will be achievable on the secondary side 44 and it is identical to loading a transformer to its full load corresponding to its rated capacity.

During the illustrative short circuit testing of the main transformer 40, the maximum output current from the secondary winding 44 is approximately 30 amps when a 110 Volt signal is applied on the primary winding of the main transformer 40. A person of ordinary skill in the art will appreciate that the transformer models and ratings are not considered limiting as other commercially available transformers 30 and 40 with different ratings that effect different short circuit test results can be used with the CI test apparatus 10.

When the current flows through the conductor or cable 70 in the circuit arrangement illustrated in FIG. 3, the cable 70 acts as a shunt to short the secondary winding 44 of the main transformer 40. In order to provide, i.e., inject a suitable amount of current over the cable or wire being shorted, the technician must adjust the variable transformer 30 to set the desired current at the outputs 50 based on the wire gauge of the cable conductors under test. The American Wire Gauge (AWG) standard (among other well-known wire standards) can be used by a technician to access various electric characteristics for different gauges/lengths of wire conductors. For example, an illustrative 14-gauge copper wire conductor is listed in the AWG standard as having a diameter of 1.62814 millimeters, 8.282 Ohms per kilometer, and a maximum rating of 5.9 amps for power transmission. Accordingly, if a technician is injecting a current across 14-gauge cables (e.g., for tracing/identifying cables or checking for ground faults), the technician will adjust the actuator 31 to set the output at the secondary windings 34 of the variable transformer 30 to deliver a suitable voltage at the primary windings 42 of the main transformer 40, which in turn produces a current at the secondary windings 44 of the transformer 44 that will not exceed the maximum current rating of 5.9 amps for the 14-gauge wires. The technician can monitor the ammeter 35 which measures the current at the outputs 50 from the secondary windings 44 of the transformer 44 while adjusting the variable transformer actuator 31 to ensure that the maximum current rating is not exceeded. In one embodiment, the actuator 31 includes one or more metrics indicators 33 such as a range of voltage values circumscribing the actuator 31 so that a technician can easily set (e.g., rotate) the actuator dial 31 to a desired metric setting. Alternatively, a range of wire-gauge values (e.g., gauges 10-24) can be provided along with, or in place of the voltage values so that the technician can simply set the actuator 31 to the appropriate wire conductor gauge without having to determine a maximum current rating associated with the wire gauge of the conductor of the cable 70.

Figure 4:
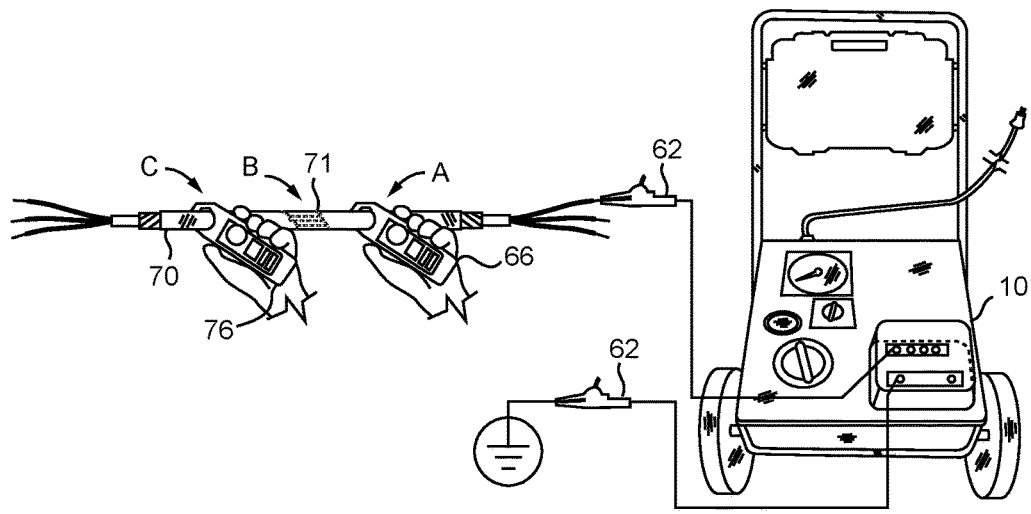
FIG. 4 is a pictorial illustration depicting the current injection test apparatus of FIG. 1 as used to inject a current over one conductor to detect a ground fault in a multi-conductor cable.

Referring to FIG. 4, the current injection test apparatus 10 is shown being used to detect an undesirable ground or short condition of a cable 70 that is routed to deliver power to a load (not shown). A cable can accidently suffer damage as a result of accidental contact, fatigue from excessive stress, among other well-known causes, and become shorted to ground at some point along the cable path so that the current flow to the load(s) is notably diminished or completely interrupted. A technician can use the CI test apparatus 10 along with a well-known commercially available electrical meter such as a clamp meter 76 to identify where a ground fault is located along the routed path of a suspect cable 70. During testing for a ground fault, power from the source is terminated and the CI test apparatus 10 is used to inject current onto the suspected damaged cable 70 by attaching the positive probe lead 62 to the proximate end of one of the conductors, e.g., the hot wire conductor) of the cable 70 and the negative probe lead 62 to ground (or other conductor, e.g., common or ground wire conductor, cable armor, and the like). The technician then uses the clamp meter 76 to detect and take readings of the injected current beginning at the proximate end of the cable 70, e.g., at location "A" in FIG. 4, and advance along towards the distal end of the cable 70. As the technician progresses along the cable 70 taking current readings, if the clamp meter 76 detects a notable decrease in the current flow readings along the cable, e.g., at location "C", the area where the change in the current readings occurs will be the general location of the damaged or shorted cable 71, e.g., at or proximate location "B". At that point, required repairs (e.g., splicing, replacement, and the like) can be made to the cable 70 and normal power from the source to the load can be restored.

Figure 5A:
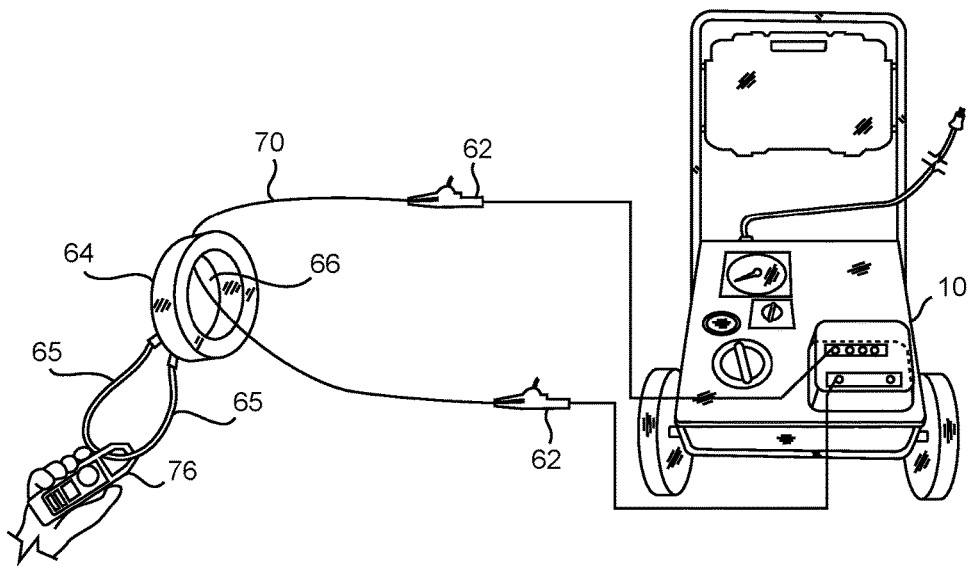
Figure 5B:
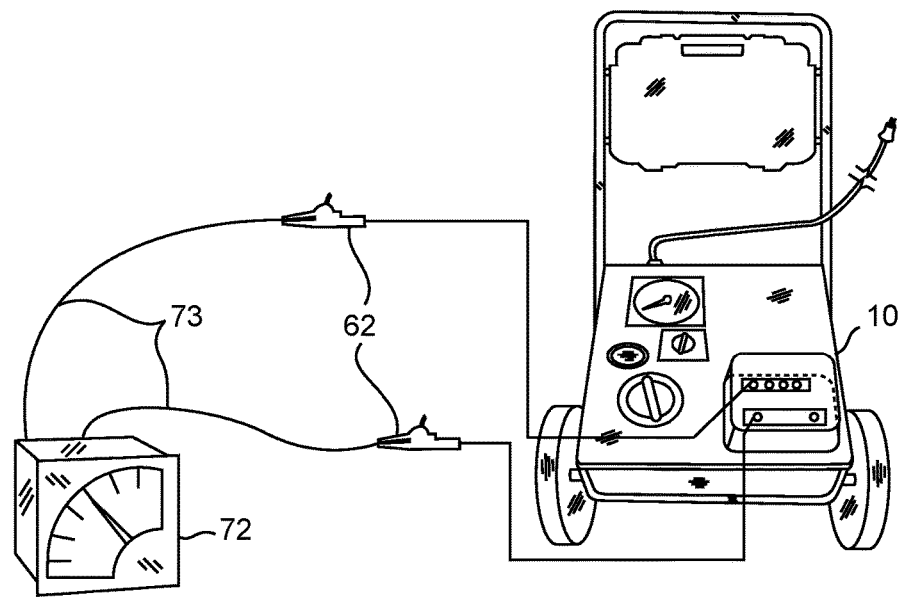
Figure 5C:
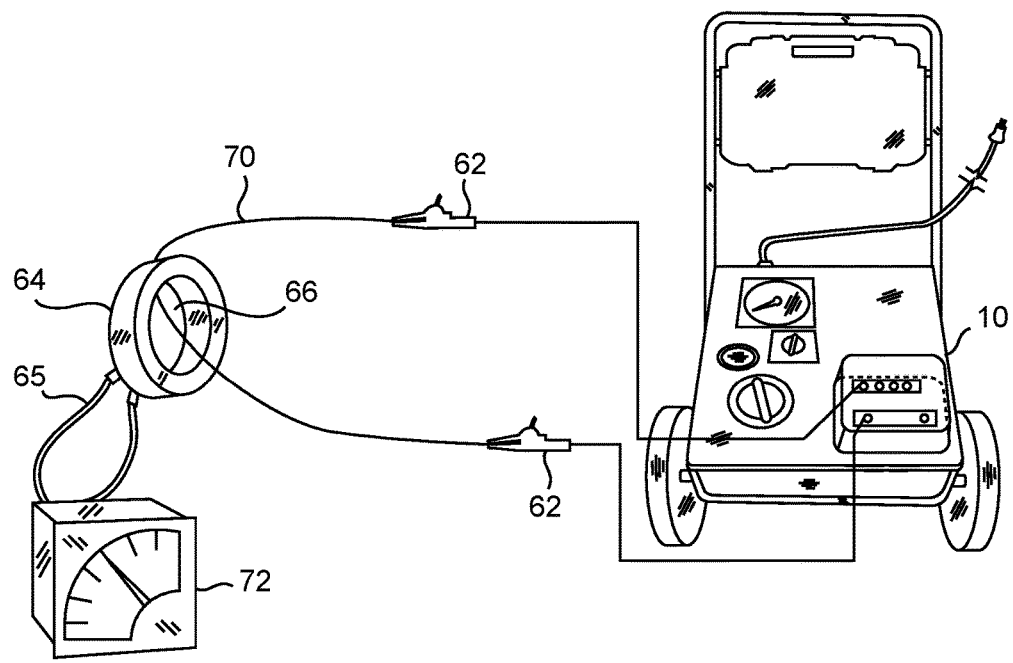

Referring to FIGS. 5A-5C, the current injection test apparatus 10 is shown being used for testing a current transformer 64 and/or an ammeter 72. Referring now to FIG. 5A, the positive and negative probe leads 62 of the CI test apparatus 10 are electrically connected to opposing ends of a length of a wire conductor 70, which is routed and extends though the wire loop 66 of the current transformer 64. The ends of the pair of lead wires 65 of the current transformer 64 are twisted together (shorted) and a clamp meter 66 can be used to obtain the induced current measurements over the twisted pair of lead wires 65. The technician uses the CI test apparatus 10 to inject an appropriate current that does not exceed the ratings of the current transformer 64 through the conductor 70 to induce a current through the shorted wires 65. More specifically, the test apparatus 10 is powered on and the appropriate output voltage/current at the outputs 50/probes 62 is manually set by adjusting the variable transformer 30, as discussed above with respect to FIGS. 1-4. Once the induced current flows through the shorted lead wires 65, the clamp meter 66 can be used to measure/calibrate the current flow of the current transformer 64.

Referring now to FIG. 5B, the CI test apparatus 10 is electrically connected to an ammeter 72 to calibrate or check its accuracy in taking measurements. Specifically, each of the pair of probe leads 62 is electrically coupled to one of the pair of wire leads 73 of the ammeter 72, and the technician can inject one or more predetermined current values over the ammeter 72 by adjusting the variable transformer 30, as described above with respect to FIGS. 1-5A. The reading on the ammeter 72 should match the reading on the ammeter 35 mounted to the CI test apparatus 10, as discussed above with respect to FIG. 1. If the values do not match, the technician can run further tests to determine if the external ammeter 72 and/or the panel ammeter 35 are improperly calibrated or defective.

Referring to FIG. 5C, an alternative method of testing of a current transformer 64 is accomplished by using an external ammeter 72 instead of the clamp meter 76 as described above with respect to FIG. 5A. Specifically, each of the pair of wire leads 65 of the current transformer 64 are electrically connected to a one of the pair of wire leads 73 of the ammeter 72. The CI test apparatus 10 is operated in the same manner as described above with respect to FIG. 5A, and the technician can observe the induced current measurements through the shorted current transformer 64 from the ammeter 72.

Figure 6:
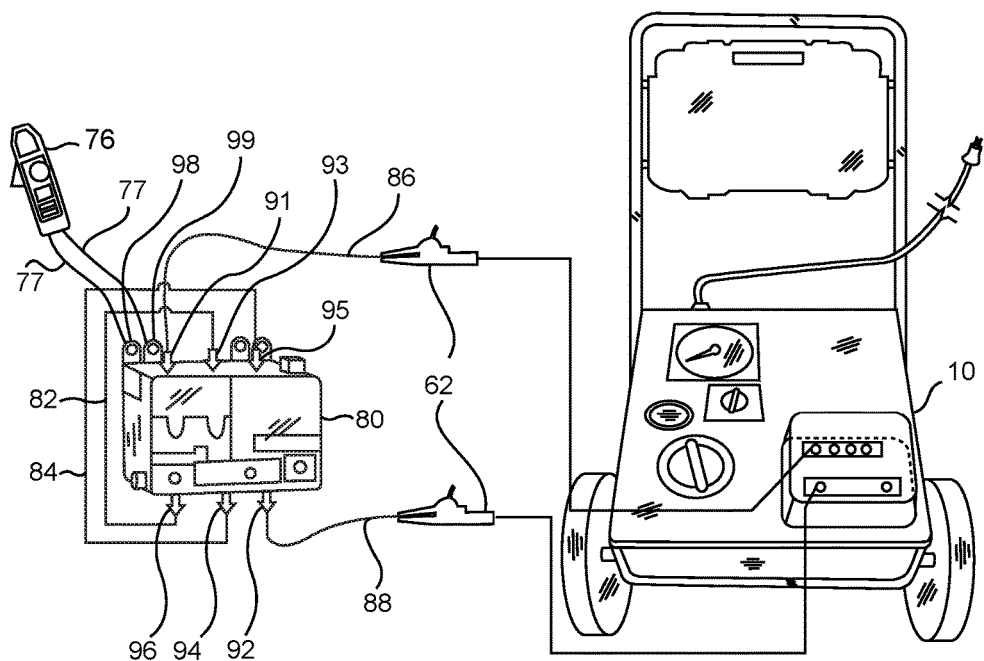
FIG. 6 is a pictorial illustration depicting the current injection test apparatus of FIG. 1 being used to test a thermal overload relay.

Referring now to FIG. 6, the CI test apparatus 10 can be used to test a thermal overload relay (TOLR) 80. A TOLR is often used to protect downstream circuitry, such as an electric motor, against damage that could result from prolonged current induced overheating conditions caused by an upstream overcurrent condition occurring at, e.g., the motor power source. The TOLR 80 is connected between the power source and the electric motor, and serves as a thermal switch to terminate power being delivered to the motor from the power source. The TOLR will trip when there is an overcurrent condition that exceeds various predetermined metrics (e.g., predetermined time, thermal values and/or current condition) that generally include the thermal characteristics/configuration of the tripping mechanisms (e.g., bi-metal materials) of the TOLR 80.

The CI test apparatus 10 can be used to inject current through the TOLR 80 and test each of the tripping mechanisms based on the manufacturer's thermal characteristics of the TOLR under test. Testing the TOLR helps to ensure accurate settings and operation prior to permanent installation with the electric motor or motor starter at a facility. The tripping mechanisms are typically bi-metal conductors that act as a shunt (or short circuited conductor) to carry current through the relay, unless they eventually deform from undesirable heat caused by excessive amounts of current flowing therethrough over a predetermined time. If the bi-metal conductors deform a predetermined amount, an open circuit occurs and the relay trips, thereby terminating power to the downstream circuitry (e.g., motor). The tripping mechanisms are tested individually by injecting a predetermined current and observing when the relay tripping mechanism is triggered. The current level at which the reference trips can be compared with the thermal characteristic curve of the relay provided by its manufacturer. To set up the testing of, for example, a first bi-metal tripping mechanism 91, one of the probes 62, (e.g., the positive probe) is electrically connected the input terminal (L1) of the first bi-metal tripping mechanism 91 either directly or indirectly illustratively using a first lead line or cable 86. The other probe 62, e.g., the negative probe 62, is similarly electrically connected to the output terminal (T1) 92 of the first bi-metal tripping mechanism 91 either directly or indirectly illustratively using a second lead line or cable 88. Cable 82 is shown as illustratively providing a shunt across the second tripping mechanism 93 as between its input terminal (L2) and output terminal (T2) 96, while cable 84 is shown as illustratively providing a shunt across the third tripping mechanism 95 as between its input terminal (L3) and output terminal (T3) 94. The probes 77 of multi-meter 76 are connected to the dry, normally open contact terminals 98 and 99 of the TOLR 80 to ensure the cutoff status of the overload relay 80 when a predetermined current is injected through the TOLR 80. All three bi-metal contacts are tested contemporaneously during a single test operation, and the tester can observe the current levels and times it takes to trip each of the relay tripping mechanisms.

During operation, the technician sets a desired current output at the terminals 50 and probes 62 in a similar manner as described above with respect to the test operations shown and discussed with respect to FIGS. 1-5C. The current being injected over through tripping mechanism under test can be adjusted (e.g., raised) manually by the technician until the bi-metal contacts deform to cause an open circuit condition and thereby trip the relay. At that time, the meter 76 can used to provide readings to confirm a measured trip current, which value can be compared to the ratings/specifications for the particular relay model being tested to ensure proper performance and/or operation within tolerance ranges.

While the foregoing is directed to several embodiments of the present invention, other and further embodiments and advantages of the invention will be apparent to those of ordinary skill in the art based on this description without departing from the scope of the invention, which is to be determined by the claims that follow.

What is claimed is:

1. A method for injecting a predetermined amount of current through an electrical conductor comprising:
   providing a portable current injector including a housing having an interior; a first transformer mounted in the housing interior and having a primary winding and a secondary winding, the secondary winding being coupled to a pair of output terminals mounted on the housing; a variable transformer mounted in the housing interior and having a primary winding, a secondary winding and a control actuator, the primary winding electrically configured to receive power from an alternating current power source, the secondary winding electrically coupled to the primary winding of the first transformer, the secondary winding of the first transformer being selectively controlled by the variable transformer control actuator; and a pair of probe leads each having a proximal end and a distal end, each proximal end being configured for electrical connection with one of the pair of output terminals, and the distal ends being configured to inject the predetermined amount of current through the electrical conductor;
   connecting a proximal end of a first of the pair of probe leads to a first of the pair of outputs of the test apparatus and a distal end of the first probe lead to a proximal end of the electrical conductor;
   electrically connecting a distal end of the electrical conductor to a common electrical contact;
   connecting a proximal end of the second of the pair of probe leads to the second of the pair of outputs of the test apparatus and a distal end of the second probe lead to the common electrical contact;
   adjusting the variable transformer control actuator to a predetermined setting;
   injecting a current through the electrical conductor via the probe leads, wherein the electrical conductor is a thermal overload relay having a current overload tripping mechanism, the tripping mechanism being electrically connected between the distal ends of the probe leads, wherein a short circuit condition is defined across the secondary winding of the first transformer while the predetermined amount of current is injected through the electrical conductor;
   adjusting the control actuator to increase the injected current through the probe leads until the tripping mechanism of the thermal overload relay trips; and
   monitoring for the injected current through the electrical conductor by measuring the injected current when the current overload tripping mechanism trips.

2. The method of claim 1, wherein the portable current injector includes a power switch to provide power from the alternating current power source to the primary winding of the variable transformer is attached to the housing.

3. The method of claim 1, wherein the portable current injector includes a cooling fan mounted in the interior of the housing and configured to receive power from the alternating current power source via a power switch.

4. The method of claim 1, wherein the portable current injector includes a current protection device for preventing passage of an undesirable power surge from the alternating current power source.

5. The method of claim 1, wherein a handle is coupled to the housing.

6. The method of claim 1, wherein the housing is mounted to a lower portion of a frame and a handle is formed by an upper portion of the frame.

7. The method of claim 1, wherein the portable current injector includes at least one rotatably-mounted support coupled proximate to a lower portion of the housing to support and move the test apparatus on a surface.

8. The method of claim 7, wherein the at least one rotatably-mounted support includes a pair of wheels rotatably mounted proximate to the lower portion of the housing.

9. The method of claim 1, wherein the portable current injector includes an ammeter mounted on the housing and electrically connected to the secondary winding of the first transformer.

10. The method of claim 1, wherein the control actuator of the variable transformer includes markings indicating at least one of a range of voltage values and a range of wire gauge values.

11. The method of claim 1, wherein the variable transformer is configured to selectively apply at the primary winding of the first transformer, up to approximately ten percent of a rated voltage of the first transformer when the secondary winding thereof is shorted, to thereby achieve a full load current at the shorted secondary winding of the first transformer.

12. The method of claim 1, wherein the variable transformer is configured to provide a voltage to the primary winding of the first transformer in a range of approximately 0-120 volts.

13. The method of claim 1, wherein the first transformer is configured to provide a maximum current output of approximately 31 amperes.

14. The method of claim 1, wherein the monitoring step comprises providing a clamp meter to measure the flow of current through the electrical conductor.

15. The method of claim 1, wherein the step of injecting a current through the thermal overload relay includes electrically connecting one of the pair of probe leads to an input terminal and the other probe lead to an output terminal of the tripping mechanism under test.

* * * * *